United States Patent
Zhang et al.

(10) Patent No.: US 6,307,458 B1
(45) Date of Patent: *Oct. 23, 2001

(54) SPLIT INDUCTOR WITH FRACTIONAL TURN OF EACH WINDING AND PCB INCLUDING SAME

(75) Inventors: Jun Zhang, Garland; Richard Farrington, Heath; William Hart, Plano, all of TX (US)

(73) Assignee: Ericsson Inc., Richardson, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 28 days.

(21) Appl. No.: 09/401,573

(22) Filed: Sep. 22, 1999

(51) Int. Cl.[7] ............................................ H01F 5/00
(52) U.S. Cl. ......................... 336/200; 336/223; 336/232
(58) Field of Search ................................. 336/200, 232, 336/223

(56) References Cited

U.S. PATENT DOCUMENTS

| | | |
|---|---|---|
| 4,692,604 * | 9/1987 | Billings ................................ 235/493 |
| 5,010,314 | 4/1991 | Estrov . |
| 5,126,715 | 6/1992 | Yerman et al. . |
| 5,179,512 | 1/1993 | Fisher et al. . |
| 5,929,733 * | 7/1999 | Anzawa et al. ........................ 336/61 |
| 5,952,909 * | 9/1999 | Umeno et al. ....................... 336/192 |
| 5,990,776 * | 11/1999 | Jitaru ................................... 336/200 |

FOREIGN PATENT DOCUMENTS

| | | |
|---|---|---|
| 0 291 403 | 11/1988 | (EP) . |
| 0 713 229 A1 | 11/1994 | (EP) . |
| 0 689 214 A1 | 12/1995 | (EP) . |
| 0 735 551 A1 | 10/1996 | (EP) . |

* cited by examiner

Primary Examiner—Anh Mai
(74) Attorney, Agent, or Firm—Arthur I. Navarro

(57) ABSTRACT

An inductor configuration (50) comprising a three-legged inductor core (20) with a first leg (22), second leg (24), and third leg (26) integrally extending from a base (28). The first leg (22) and second leg (24) are predisposed and spaced about a first surface (30) of the base (28) to form a first channel area (32). The second leg (24) also forms, along with the third leg (26), a second channel area (34) separated from the first channel area (32) by the second leg (24). The inductor also comprises an inductor winding (36) arranged about the inductor core (20) to provide relatively equal magnetic flux through the first leg (22), second leg (24), and third leg (26) when current flows through the inductor winding (36). The inductor configuration may be used as an input or output inductor for a synchronous rectifier circuit (100).

4 Claims, 4 Drawing Sheets

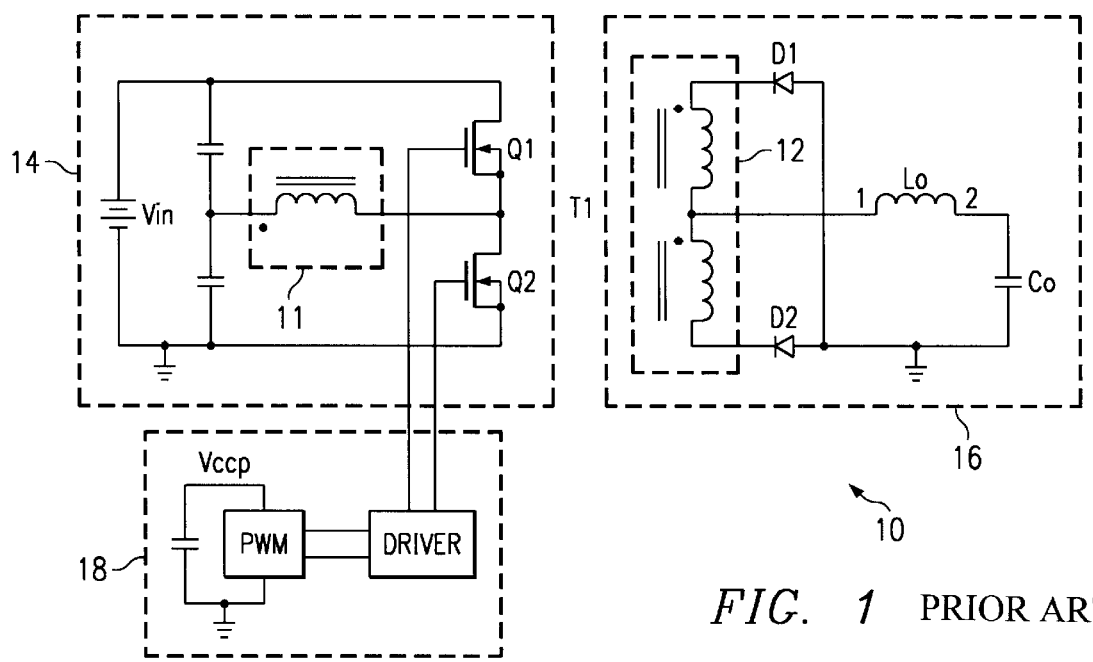
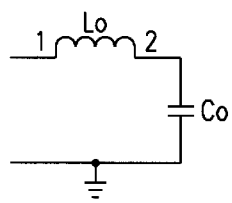
FIG. 2A
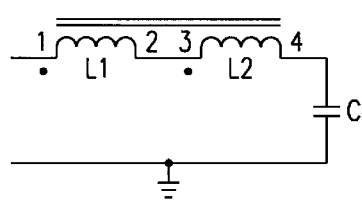
FIG. 2B
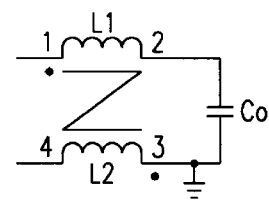
FIG. 2C
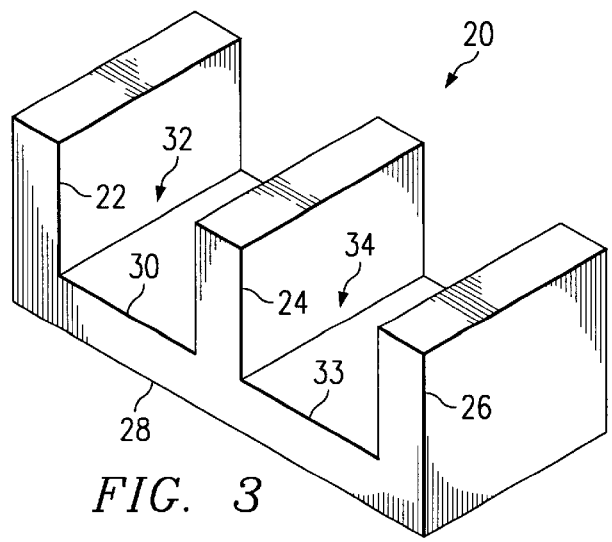
FIG. 3

SPLIT INDUCTOR WITH FRACTIONAL TURN OF EACH WINDING AND PCB INCLUDING SAME

TECHNICAL FIELD

The invention relates generally to logic integrated circuits and more particularly, to a simplified split winding inductor configuration, easily adapted to a synchronous rectifier circuit. More particularly, the present invention provides an output inductor for a power module that integrates the output inductor winding into the printed circuit board assembly to decrease the cost and complexity of the design and improve noise performance.

BACKGROUND OF THE INVENTION

The growth of the distributed power market has lead to increased research in the area of power modules. As a result, the power density of power modules has increased four times in the past few years, and the efficiency of power modules has significantly increased due to the improvement of current semiconductor devices and the utilization of synchronous rectification for power module applications. As logic integrated circuits have migrated to lower working voltages in the surge for higher operating frequencies and as overall system sizes have continued to decrease, power supply designs with smaller and higher efficiency power modules have increased in demand.

In an effort to improve the efficiencies and increase power densities, synchronous rectification has become necessary for these types of applications. Synchronous rectification has gained great popularity in the last ten years as low voltage semiconductor devices have advanced to make this a viable technology. The power electronics design engineer, however, is still challenged to design power modules with high power density, high efficiency, low output voltage and high output current.

Power modules having synchronous rectification have generally comprised a single winding output inductor connected to the output load of the synchronous rectifier circuit. This has generally been the most popular approach because of its simplicity and reduced part count. A power module configuration known as a "quarter brick" can be used in applications where board space is limited. One version of a quarter brick power module measures 2.28" long by 1.45" wide by 0.5" in height.

The quarter brick power module, as well as other similar power module configurations, typically places the input pins and output pins on opposite ends of the assembly. Essentially, the packaging and layout constraints require the output inductor to be terminated at opposite ends with respect to both the input and output sides of the inductor. This configuration results in a winding configuration with an extra half turn which, in turn, effects the resultant magnetic flux patterns of the inductor core. In particular, the inductance of the fractional turn created by the termination of the output inductor increases with current so that the inductor is easily saturated.

SUMMARY OF THE INVENTION

The present invention achieves technical advantages as a split inductor that can be easily adapted to a synchronous rectifier circuit as an output inductor. The present invention, which comprises a new split inductor design, can be integrated within a quarter brick power module to combine the inductor windings and magnetics onto a scale platform. An optimum layout and package configuration is attained without compromising the design of the output inductor.

As such, according to one embodiment, disclosed is a split inductor winding configuration comprising an inductor core having first, second, and third legs extending from a base member. The first and second legs are predisposed and spaced about a surface of the base member to form a first channel area. The second leg also forms, along with the third leg, a second channel area separated from the first channel area by the second leg. The inductor also comprises inductor windings arranged about the inductor core to provide relatively equal magnetic flux through the first, second, and third legs when current flows through the inductor winding.

In one embodiment of the present invention, the split inductor is integrated within a printed circuit board (PCB) assembly which comprises a plurality of PCB layers. Each of the PCB layers includes a conductive core sub-layer predisposed between two base material sub-layers with each conductive core sub-layer formed into desired circuit pathways. The PCB assembly also comprises a plurality of insulation layers predisposed between the PCB layers and first, second, and third openings extending through the PCB layers. The openings are arranged to accept an inductor core, according to the teachings of the present invention, with a corresponding leg of the inductor core capable of being inserted through a corresponding opening of the PCB assembly.

In yet another embodiment, the present invention is utilized in a synchronous rectifier circuit with the split inductor configuration forming the output inductor on the secondary side of a synchronous rectifier circuit.

A technical advantage of the present invention is the easy adaptation of the inductor configuration of the present invention into power module assembly, such as the quarter brick power module.

Yet another technical advantage of the present invention is that the new inductor configuration can be used to filter out the common mode noise and reduce the output noise of the filter circuit.

Still another technical advantage of the present invention is the use of the split inductor configuration of the present invention in other power supply circuit topologies, such as full-bridge and push-pull.

BRIEF DESCRIPTION OF THE DRAWINGS

The above features and advantages of the present invention will be more clearly understood from consideration of the following descriptions in connection with accompanying drawings in which:

FIG. 1 is an illustration of the prior art single inductor configuration in a synchronous rectifier circuit;

FIGS. 2A–C illustrate equivalent configurations for an output inductor having a load (Co);

FIG. 3 shows the split inductor of the present invention;

Corresponding numerals and symbols in the different figures refer to corresponding parts unless otherwise indicated.

DETAILED DESCRIPTION OF PREFERRED EMBODIMENT

Figure 4A:
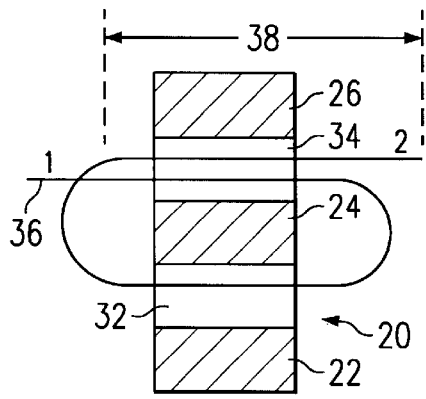
FIG. 4A is a top view of the present invention with an unequal number of winding turns.

The following is a description of the present invention. A prior art halfbridge DC-to-DC converter circuit will be discussed first, followed by a description of several preferred embodiments of the present invention, and a discussion of the advantages.

FIG. 1 is an illustration of the use of a single inductor (Lo) in a synchronous rectifier circuit 10 for a half-bridge DC-to-DC converter. The synchronous rectifier circuit 10 comprises a primary transformer T1 having a primary and a secondary winding 11 and 12, respectively. The synchronous rectifier circuit 10 also comprises an external drive circuit 18, which is used to drive the synchronous rectifiers Q1 and Q2.

In particular, the first and second synchronous rectifiers Q1 and Q2 are operably coupled to the primary transformer T1 and the external drive circuit 18. The timing signals, which turn on and off the synchronous rectifiers Q1 and Q2, are derived from the external drive circuit 18. This timing information is then transferred from the primary side 14 to the secondary side 16 of the rectifier circuit 10 utilizing primary transformer T1.

Traditionally, a single output inductor (Lo) is used as shown in FIG. 1. According to the prior art, the use of a single inductor (Lo) is preferred because of its simplicity and reduced part count. However, in some applications the output inductor (Lo) is split into two identical windings connected at each side of the output capacitor to increase common mode noise rejection. Obviously, a two winding structure results in increased cost and complexity. Another approach is to wind two windings over the same inductor core, but this configuration increases the complexity of the manufacturing process. What is needed is a inductor configuration which increases common mode noise rejection but does not increase the complexity of the manufacturing process. The present invention provides such a configuration for the output inductor in a power module assembly useful in synchronous rectifiers such as that shown in FIG. 1.

FIGS. 2A–C illustrate equivalent configurations for an output inductor of a synchronous rectifier circuit. FIG. 2A shows the traditional single inductor configuration as discussed above. The single inductor (Lo) may be split into two identical windings L1 and L2, as shown in FIG. 2B, and placed in series with an output capacitor (Co). This configuration, however, does not provide the needed filtering of noise in the circuit. To increase common mode noise rejection, the two identical windings L1 and L2, shown in FIG. 2B, may be reconfigured by placing the windings L1 and L2 at each side of the output capacitor, as shown in FIG. 2C.

The present invention is a split inductor configuration having the two windings connected at each end of the output capacitor. However, the present invention provides the added advantage of decreased cost and decreased complexity of the manufacturing process compared to prior art split inductor configurations of FIGS. 2A and 2B. To better understand the present invention, reference is made to FIG. 3, which illustrates an inductor core 20 having first, second, and third legs 22, 24, and 26, respectively, integrally extending from a base member 28. The first leg 22 and second leg 24 are predisposed, spaced and extend substantially perpendicular from a first surface 30 of the base member 28 to form a first channel area 32. Likewise, the second leg 24 and the third leg 26 are predisposed, spaced and extend substantially perpendicular from a second surface 33 to form a second channel area 34 separated from the first channel area 32 by the second leg 24.

As shown in FIG. 4A, which is a top view of a three-legged inductor core 20 suitable for use in the inductor configuration 50 (shown in FIG. 5A) of the present invention, inductor winding 36 can be wound about the inductor core 20, creating signal paths in the channel areas 32 and 34. The inductor winding 36 may be formed of any conducting material such as copper, for example. The incuctor winding 36 as arranged, however, results in one whole turn about the first leg 22, second leg 24, and third leg 26, respectively, and an additional fractional turn 38 between the second leg 24 and third leg 26. This fractional turn 38 results in one signal path through the first channel area 32 and two signal paths through the second channel area 34. The effective inductance created by the fractional turn 38 will vary with current and can easily saturate the output inductor (Lo), which is undesirable.

Figure 4B:
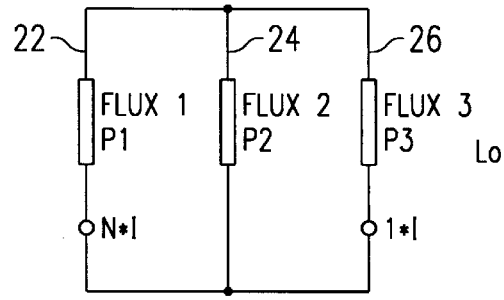
FIG. 4B illustrates the magnetic properties of the present invention with an unequal number of winding turns.

The saturation phenomenon is illustrated in FIG. 4B which shows the magnetic circuit of an inductor (Lo) with a fractional turn 38 (shown in FIG. 4A). P1, P2, and P3 are the permeance of the first, second, and third legs 22, 24, and 26, respectively. Flux1, Flux2, and Flux3 represent the magnetic flux that goes through each leg 22, 24, and 26. N*1 and 1*1 are the MMFs in each leg. As the current increases, more flux is pushed away from the third leg 26 into the second leg 24. Essentially, the effective inductance reduces as the load current increases. Eventually the inductor core 20 will be saturated because too much of the flux is pushed into the second leg 24.

Figure 5A:
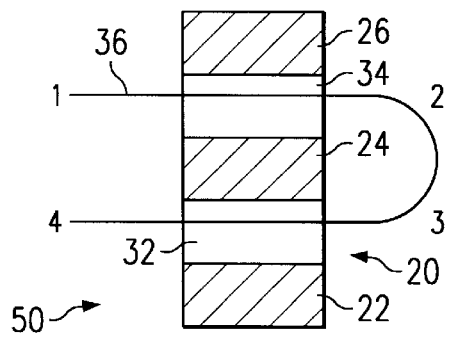
FIG. 5A is a top view of the present invention with an equal number of winding turns.

The present invention provides an inductor configuration 50 wherein the inductor winding 36 is arranged about the inductor core 20 to balance the magnetic flux in each leg 22, 24, and 26. In order to provide relatively equal magnetic flux through the first, second, and third legs 22, 24, and 26, respectively, when current flows through the inductor winding 36, the inductor winding 36 is arranged to provide an equal number of signal paths through the first channel area 32, defined by the first leg 22 and second leg 24 and the second channel area 34, defined by the second leg 24 and third leg 26. This configuration, denoted generally as 50, is shown in FIG. 5A.

Figure 5B:
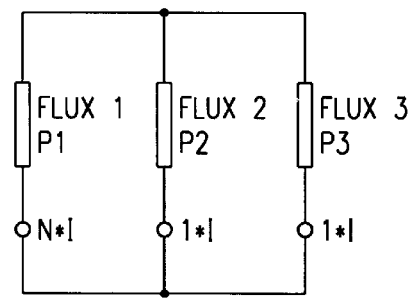
FIG. 5B illustrates the magnetic properties of the present invention with an equal number of winding turns.

FIG. 5B shows the equivalent magnetic circuit for the inductor configuration, according to the present invention. The MMFs and permeance in the first leg 24 and third leg 26 are exactly the same so that the magnetic flux is balanced in the first let 24 and third leg 26. The fact that equal number of signal path are created in the channel areas 32 and 34 means that the inductor core 20 will not saturate.

Accordingly, the inductor configuration 50 may be integrated within a printed circuit board (PCE3) assembly and used as an output inductor (Lo) for a synchronous rectifier circuit suitable for use in power regulation applications. The inductor configuration 50 is shown with the output inductor of a quarter brick power module as an example, but the present invention provides a general solution in optimizing the PCB package and layout without compromising the design of input and/or output inductors.

Figure 6:
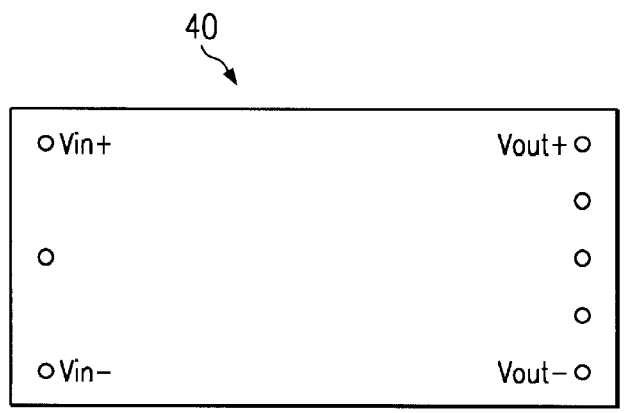
FIG. 6 are simple diagrams of the voltage inputs and outputs for a printed circuit board.
Figure 7:
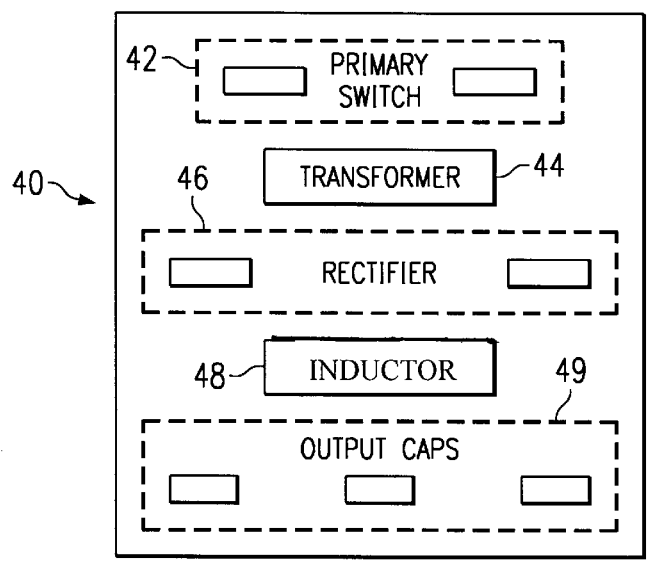
FIG. 7 is a simple block diagram of a printed circuit board with synchronous rectification.

FIG. 6 shows a typical mechanical representation of a standard quarter brick power module 40. The packaging and layout constraints require the output inductor to be terminated at opposite sides of the structure resulting in a winding with a half turn. As shown, the input pins Vin+ and Vin− and output pins Vout+ and Vout− are located at opposite ends of the module. The normal part location for a power brick module 40 is shown in the FIG. 7. The module 40 can be divided into the sections of a primary switch 42, transformer 44, rectifier 46, output inductor 48 and output capacitors 49. The ideal situation is for the current to go into the inductor section 48 from rectifier section 46 of the inductor (terminal 1, not shown, close to the rectifier section 46), and come out at the output capacitor 49 (terminal not shown, 2 close to the output capacitor section 49).

Figure 8A:
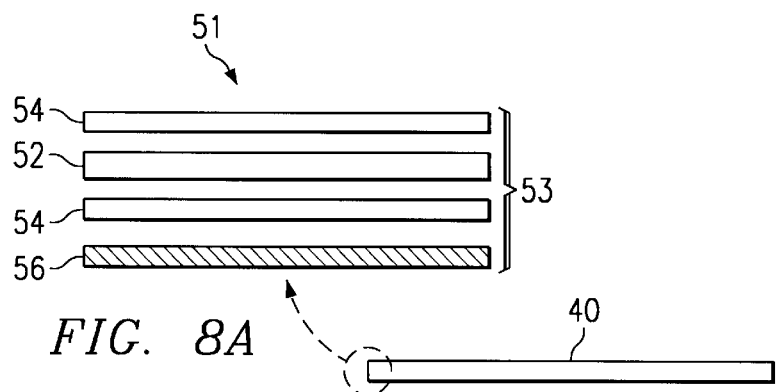
FIG. 8A illustrates the layers of the printed circuit board in which the present invention is integrated.

FIG. 8A illustrates the layers of the printed circuit board (PCB) 51 in which inductor configuration 50 of the present invention can be integrated. The PCB 51 comprises a plurality of PCB layers 53. Each of the PCB layers 53 include a conductive core sub-layer 52 predisposed between two base material sub-layers 54. The conductive core sub-layer 52 may comprise any conducting material, such as aluminum or copper, for example, or other similar conductors. Each conductive core sub-layer 52 is formed into the desired circuit pathways which are utilized to connect the circuit components (i.e. inductor, capacitors, transformer), to the assembly 51.

Figure 8B:
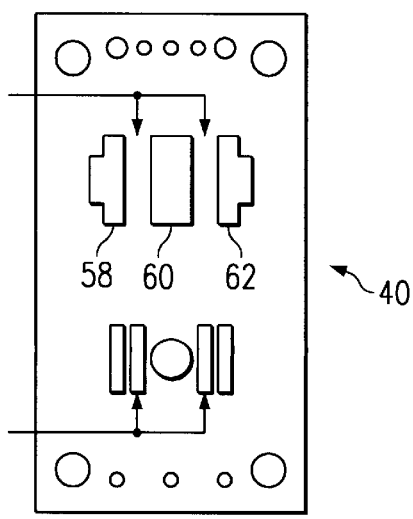
FIG. 8B is a top view of the printed circuit board.

The PCB 51 also comprises a plurality of insulation layers 56 predisposed between the PCB layers 53 within first, second, and third openings 58, 60, and 62, respectively (shown in FIG. 8B), extending through the plurality of PCB layers 53 and arranged to support the insertion of the three-legged inductor core 20 of FIG 3. In particular, each leg 22, 24 and 26 of the inductor core 20 would be inserted into a corresponding opening 58, 60 and 62. A portion of each conductive core sub-layer 52 is further formed into a split inductor winding 36, which provides an equal number of signal paths through the first and second channel areas 32 and 34, as shown in FIG. 4A.

The process and fabrication techniques of forming such an inductor winding 36 within the core sub-layers 52 is well known in the art. The inductor winding 36 can be split into two winding portions (not shown) containing a half-turn to optimize the package and layout requirements, but with an effective winding containing no half or fractional turns. Therefore, the PCB 51 is optimized without compromising the design and performance of the inductor.

An advantage of the PCB 51 is that the power module can be integrated with the magnetics to further simplify the manufacturing process, since the inductor windings 36 are buried inside the PCB 51 and no termination is required.

Figure 9:
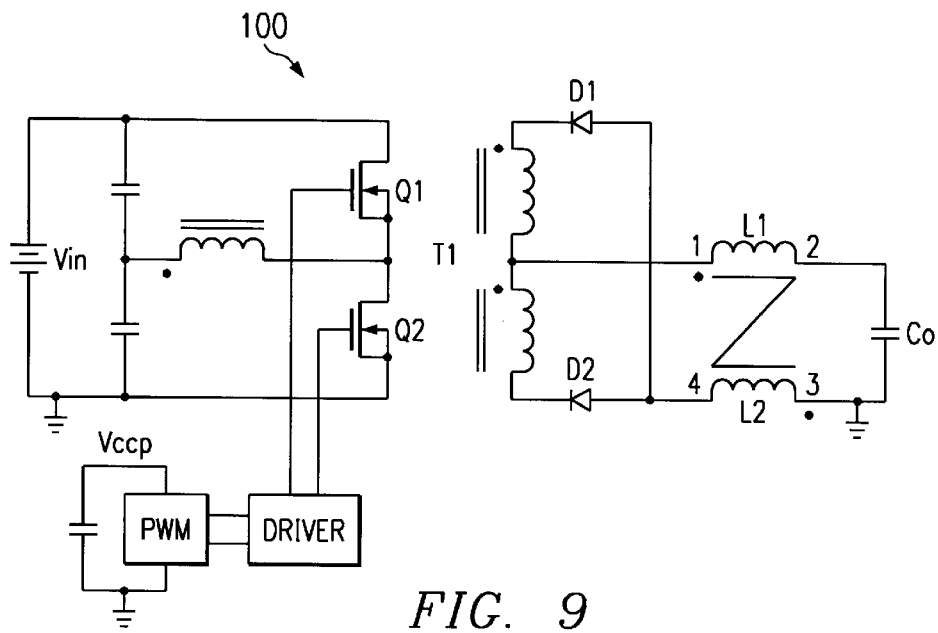
FIG. 9 is a circuit schematic of the present invention as implemented as a synchronous rectifier circuit.
Figure 10A:
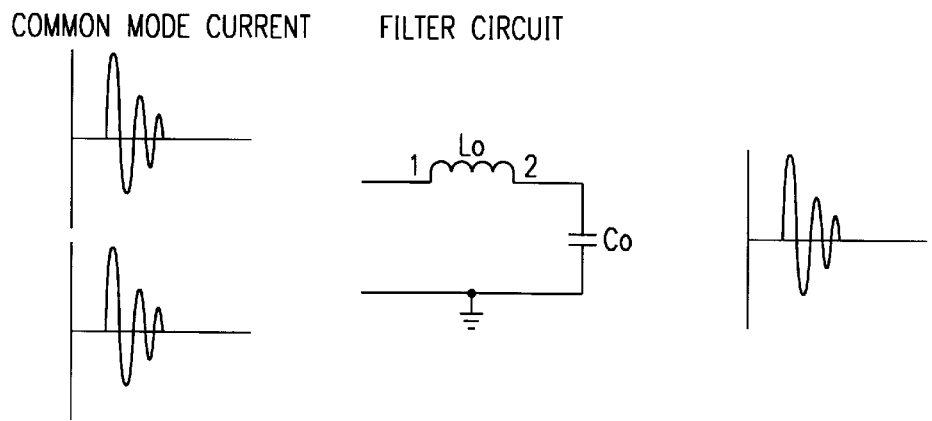
FIGS. 10A and 10B illustrate the differential noise of the prior art circuit and the circuit of the present invention.
Figure 10B:
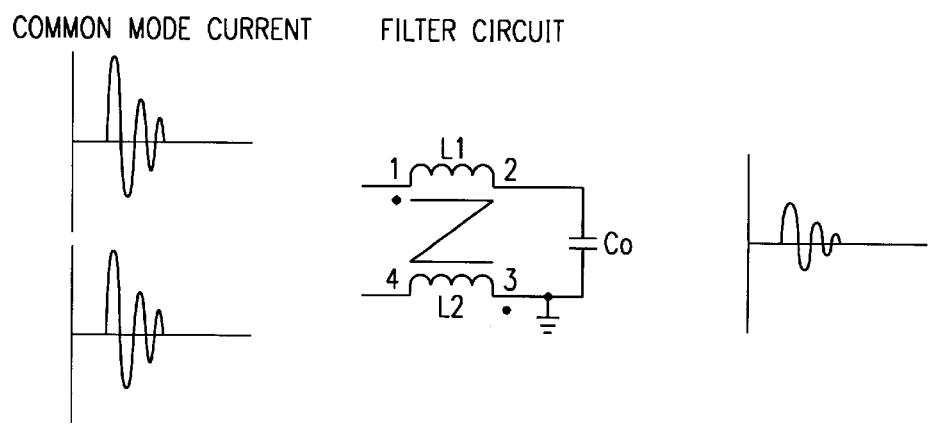

A circuit schematic illustrating the split inductor configuration 50 in a synchronous rectifier circuit is shown and denoted generally as 100 in FIG. 9. The split inductor configuration 50 not only makes the circuit layout much better, but also filters out the common mode noise and reduces the output noise. The common mode current is shown in FIGS. 10A–B. In the conventional approach, the common mode current that is generated by switching will produce differential mode noise on the output (shown in FIG. 10A) because of the different impedance in each current path. In the new approach, the impedance in each current path is similar or can be matched so that the differential noise will be reduced or no differential noise will be generated by the common mode current, as shown in FIG. 10B. Furthermore, this concept can be extended to input inductor.

The novel method and system of the present invention provides the advantage of being cost effective to manufacture using standard fabrication processes and techniques. Another advantage is the reduction in common mode noise due to the split inductor winding configuration 50. Yet another advantage of the present invention is the prevention of saturation of the inductor core 20.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description.

What is claimed is:

1. A printed circuit board (PCB) assembly with an onboard inductor comprising:

a plurality of PCB layers, each of said layers including a conductive core sub-layer predisposed between two base material sub-layers, each conductive core sub-layer formed into circuit pathways, said circuit pathways adapted to connect circuit components to said PCB assembly;

a plurality of insulation layers predisposed between each PCB layer;

an inductor core having a base with first, second and third legs extending therefrom;

first, second and third openings extending through said plurality of PCB layers, said openings adapted to accept said inductor core; and split inductor windings integrated into said plurality of PCB layers and arranged about said inductor core in order to balance the magnetic flux in each of said first, second and third legs;

wherein said split inductor windings adapted to provide an equal number of signal paths through a first area defined by said first and second openings and through a second area defined by said second and third openings.

2. The PCB assembly according to claim 1 wherein said split inductor winding configuration is integrated within a quarter brick power module to combine the inductor windings and magnetics onto a scale platform, said power module having input pins (Vin+ and Vin−) and output pins (Vout+ and Vout−) located at opposite ends of said module.

3. The PCB assembly according to claim 2 wherein said power module is divided into sections including a primary switch section, a transformer section, a rectifier section, an output inductor section and an output capacitor section.

4. The PCB assembly according to claim 1 wherein said split inductor windings have the characteristic of filtering out common mode noise and reducing output noise.

* * * * *